United States Patent
Stowell et al.

(10) Patent No.: US 6,181,727 B1
(45) Date of Patent: Jan. 30, 2001

(54) COATING FOR REDUCING OPERATING TEMPERATURES OF CHAMBER COMPONENTS OF A COATING APPARATUS

(75) Inventors: William R. Stowell, Rising Sun, IN (US); John F. Ackerman, Laramie, WY (US); Jeffrey A. Conner, Hamilton, OH (US); John D. Evans, Sr., Springfield, OH (US); Antonio F. Maricocchi, Loveland, OH (US)

(73) Assignee: General Electric Company, Cincinnati, OH (US)

( * ) Notice: Under 35 U.S.C. 154(b), the term of this patent shall be extended for 0 days.

(21) Appl. No.: 09/293,965

(22) Filed: Apr. 19, 1999

(51) Int. Cl.[7] ................. H01S 3/08; H05B 3/20; C23C 16/00
(52) U.S. Cl. ............ 372/99; 359/585; 359/584; 359/586; 18/620; 18/641; 18/724; 18/715
(58) Field of Search ................. 118/715, 724, 118/716, 727 VE, 620, 641; 396/611; 427/569, 576; 156/345; 372/99

(56) References Cited

U.S. PATENT DOCUMENTS 5,576,885 * 11/1996 Lowe et al. ................. 359/585
5,972,114 * 10/1999 Yonenaga et al. ................. 118/715
6,021,152 * 2/2000 Olsen et al. ................. 372/99
6,025,575 * 2/2000 Park et al. ................. 219/405

OTHER PUBLICATIONS

U.S. Patent application Ser. No. 09/224,891, filed Dec. 31, 1998, "Heating Apparatus for a Welding Operation and Method Therefor" by Jeffrey A. Conner, et al.

* cited by examiner

Primary Examiner—Richard Bueker
Assistant Examiner—P. Hassanzadeh
(74) Attorney, Agent, or Firm—Andrew C. Hess; Gerry S. Gressel

(57) ABSTRACT

A component for use in a high-temperature environment such as the coating chamber of a PVD apparatus. A reflective coating on the component serves as a barrier to radiant heat transfer to the component by reflecting thermal radiation. The coating comprises at least one pair of reflective layers, each layer being formed of a material that is essentially transparent to electromagnetic wavelengths of between 500 and 3000 nanometers (nm). In addition, the material of the outermost layer of the pair has a higher index of refraction than the material of the other layer of the pair.

18 Claims, 4 Drawing Sheets

COATING FOR REDUCING OPERATING TEMPERATURES OF CHAMBER COMPONENTS OF A COATING APPARATUS

FIELD OF THE INVENTION

This invention relates to coatings for components exposed to high temperatures, such as coating chamber components of coating apparatuses. More particularly, this invention is directed to a reflective coating for a coating chamber component of a coating apparatus, by which the maximum temperature sustained by the component during the coating process is reduced.

BACKGROUND OF THE INVENTION

Physical vapor deposition (PVD) is a known film deposition technique that entails heating a material in a vacuum to a temperature at which the material vaporizes and then condenses on a relatively cooler substrate. For various reasons, metallic and ceramic coatings for gas turbine engine components are often deposited by PVD. For example, electron beam physical vapor deposition (EBPVD) is used to produce a desirable columnar grain structure for ceramic topcoat layers of thermal barrier coating (TBC) systems. The ceramic material often preferred is yttria-stabilized zirconia (YSZ), which must be heated to about 4000 K to about 4300 K to produce a YSZ vapor that subsequently condenses on the component.

Gas turbine engine components typically sustain temperatures in excess of 1700° F. (about 927° C.) during coating by PVD. As a result of stringent requirements to control temperature uniformity during the coating cycle, a "working zone" is typically established in the PVD coating chamber within which sufficient temperature and coating vapor uniformity can be maintained to meet processing requirements. Components to be coated must be held and manipulated in the working zone of the coating chamber using complex tooling and fixturing. As a result, this tooling and fixturing is exposed to the same elevated temperatures seen by the components receiving the PVD coating, necessitating that the tooling and fixturing be fabricated from materials that can survive the high-temperature coating environment of a PVD coating chamber. Notable examples are the gears required to rotate components in order to deposit by EBPVD a ceramic layer with a columnar grain structure.

Though high-temperature materials are used to form the tooling and fixturing, repetitive high-temperature exposures and associated thermal cycling results in physical degradation of these components, which necessitates their replacement on a routine basis. Because of the costs associated with their complexity and high temperature capability, it would be desirable if the frequency of replacing PVD components, tooling and fixturing could be reduced.

BRIEF SUMMARY OF THE INVENTION

The present invention generally provides a component for use in a high-temperature coating chamber such as that of a PVD apparatus. The invention is particularly directed to a thermally-reflective coating for those coating chamber components that must repeatedly survive the high temperatures within the working zone of a PVD apparatus. The reflective coating serves as a barrier to radiant heat transfer to the component by reflecting thermal radiation within the coating chamber, and particularly thermal radiation at wavelengths at which radiant heat transfer to the component is greatest from the surrounding chamber environment.

In accordance with this invention, the thermally-reflective coating comprises at least one pair of reflective layers, each layer being formed of a material that is essentially transparent to electromagnetic wavelengths of between 500 and 3000 nanometers (nm). In addition, the material of the outermost layer of the pair has a higher index of refraction than the material of the second layer of the pair. Coatings of this invention have been shown to increase the average reflectivity of a PVD coating chamber component formed of steel from about 70% to more than 90% over an electromagnetic wavelength range of about 380 to about 1500 nm, which is within the spectrum for thermal radiation (near-infrared) emitted by molten ceramic materials, and therefore the cause of considerable heating during the deposition of ceramic materials. Accordingly, the operating temperature of a coating chamber component can be significantly reduced by the thermally-reflective coating of this invention. Also reduced are thermal gradients within the component, which particularly occur if only a portion of the component is within the working zone of the coating chamber.

From the above, it can be seen that the advantages of this invention include the ability to improve the life of critical components, tooling and fixturing used in the coating chamber of a PVD coating apparatus. As a result, the cost of operating the coating apparatus is reduced. The reflective coating of this invention is able to achieve these advantages while present in thicknesses of less than 5000 nm, which allows the coating to be applied to standard tooling and fixturing without resulting in any significant dimensional or tolerance issues. The reflective coating of this invention has also been found to be very hard and durable, reducing the concern for damage due to handling. Finally, PVD metallic and ceramic coatings do not adhere well to the reflective coating, so that removal of any PVD coating that is inadvertently deposited on the component can be easily removed.

Other objects and advantages of this invention will be better appreciated from the following detailed description.

DETAILED DESCRIPTION OF THE INVENTION

The present invention is generally directed to components, tooling and fixturing used in high temperature coating chambers, and particularly PVD coating chambers in which metallic and ceramic coatings are applied to superalloy articles. While the advantages of this invention will be described with reference to a PVD coating apparatus, the invention is generally applicable to apparatuses in which components must repeatedly survive exposures to elevated temperatures.

Figure 1:
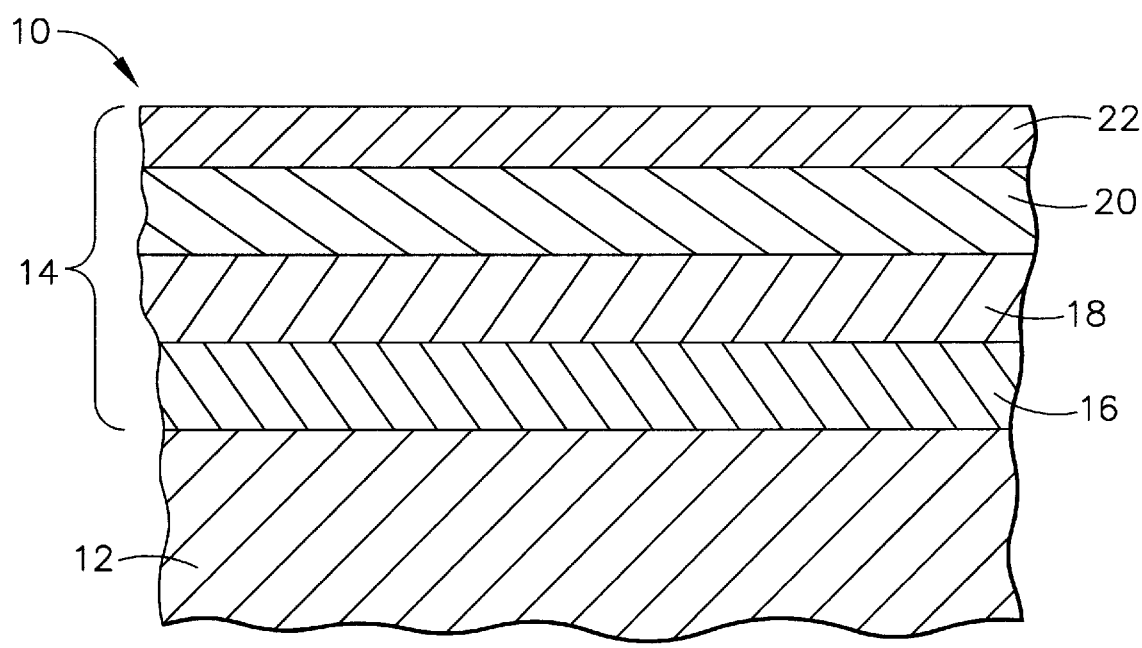
FIG. 1 shows in cross-section a portion of a coating chamber component with a reflective coating in accordance with this invention.

PVD coating apparatuses and their required tooling and fixturing are well known in the art. A surface portion of a component 10, for example a gear, tool or fixture, of a PVD coating apparatus is represented in cross-section in FIG. 1. For use within the working zone of a typical PVD coating chamber, the component 10 is preferably formed of a material capable of withstanding temperatures in excess of about 1000° F. Suitable materials for this purpose include nickel-based alloys, including Ni-based superalloys such as HASTELLOY X®. Coating chamber components outside the working zone may be formed of lower temperature materials, including stainless steels and copper and its alloys. The component 10 represented in FIG. 1 is shown as having a multilayer coating system 14 deposited on a surface of its substrate 12 by such methods as sputtering and ion plasma deposition. According to this invention, the coating system 14 promotes the reflection of infrared radiation emitted by the coating chamber heating source as well as the other surfaces within the chamber that emit infrared radiation as a result of their elevated temperatures sustained during the coating process. A notable example is the molten pool of zirconia present when forming a thermal barrier coating of YSZ by EBPVD.

The coating system 14 (not shown to any particular scale) is shown in FIG. 1 as comprising four layers 16, 18, 20 and 22 of ceramic materials, which will be discussed below as paired layers 16/18 and 20/22. It is within the scope of this invention that any number of paired layers could be used. The significance of using pairs of layers is based on the optical construction interference effect of two materials that are transparent to the wavelengths of interest, but have different indices of refraction to achieve phase augmentation of the wavelengths to be reflected by the component 10. Those skilled in the art will appreciate that phase augmentation requires each pair of layers 16/18 and 20/22 to have different indices of refraction, with the layer nearest the source of radiation (e.g., layer 18 of paired layers 16/18 and layer 22 of paired layers 20/22) having the higher index. In addition, the layers of a given pair preferably have different thicknesses based on the wavelength to be reflected and their respective indices of refraction according to the quarter-wave equation:

$$t = \lambda/4n$$

where t is the required thickness of a coating layer in nanometers, λ (lambda) is the wavelength of interest in nanometers, and n is the index of refraction of the coating layer material.

The four-layer coating system 14 shown in FIG. 1 has the advantage of providing a balance between performance (reflectivity) and processing and cost considerations, though the desired optic effect can be enhanced with additional paired layers. For example, a suitable number of layers for the coating system 14 is believed to be in the range of about sixteen to fifty, with thirty-two layers (sixteen pairs) being preferred for performance reasons. Suitable ceramic materials for the layers 16, 18, 20 and 22 include refractory fluorides and metal oxides such as silica ($SiO_2$), alumina ($Al_2O_3$), titania ($TiO_2$), tantala ($Ta_2O_5$), zirconia ($ZrO_2$), thoria ($ThO_2$) and niobium oxide ($Nb_2O_5$), though other oxides could be used. These materials can be categorized for purposes of this invention as either high or low index materials. For example, sputtered refractory fluorides, silica and alumina have relatively low indices of refraction, generally in the range of about 1.25 to about 1.7, while titania, tantala, zirconia and niobium oxide have higher indices of refraction, generally in the range of about 2 to about 2.3. While oxides are preferred materials for the layers 16, 18, 20 and 22 of the coating system 14 because of their high temperature capability, it is possible that other materials could be used if they meet the requirements for thermal stability at the maximum service temperature of the component 10, transparency to the wavelengths of interest, and provide indices of refraction compatible with the reflectivity sought for the coating system 14.

Based on the quarter-wave equation noted above, suitable thicknesses for the coating system 14 will be dependent on the materials used and the number of layers that form the coating system 14. Also from the equation, the coating layers with the lower indices of refraction (e.g., 16 and 20) should be thicker than the layers with the higher indices of refraction (e.g., 18 and 22). More particularly, for paired layers intended to reflect a given wavelength of interest, the lower-index layer (e.g., 16 and 20) is preferably thicker than its paired higher-index layer by a factor inversely proportional to their indices of refraction. In one example, layers 16 and 20 are silica, while layers 18 and 22 are titania. Based on indices of refraction of about 1.5 and 2.2 for silica and titania, respectively, if radiation having a wavelength of between about 700 and 1300 nm is to be reflected, a suitable thickness for the silica layers 16 and 20 is about 117 to 217 nm, and a suitable thickness for the titania layers 18 and 22 is about 80 to 148 nm. The total thickness for this coating system 14 would then be in the range of about 394 to 734 nm. More generally, a multilayer reflective coating system in accordance with this invention is able to achieve the advantages of the invention with a total coating thickness of less than 5000 nm, with a suitable thickness range being about 100 to about 4000 nm.

Figure 4:
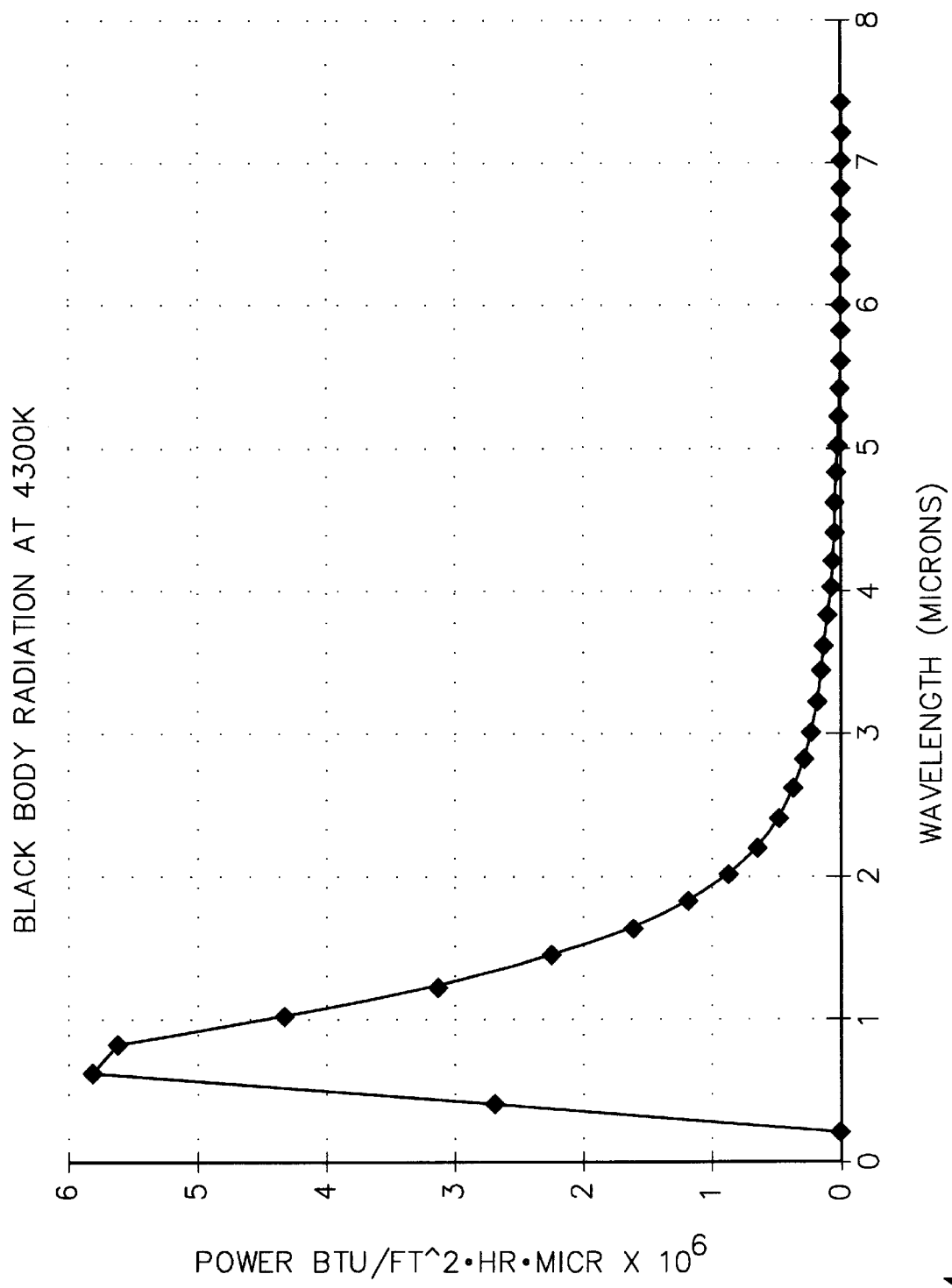
FIG. 4 is a graph representing the black body radiation typical during deposition of yttria-stabilized zirconia by PVD.

As a particularly suitable embodiment of this invention, a thirty-two layer coating system was developed with alternating pairs of silica and titania layers. This coating system was evaluated during an investigation in which the thermal radiation characteristics of HS188 cobalt-base alloy specimens were determined under conditions representative of a PVD coating operation. FIG. 4 represents the electromagnetic radiation spectrum typical during the deposition of YSZ by EBPVD, during which a zirconia ingot is heated to a temperature of about 4000 K to about 4300 K. As evident from FIG. 4, radiation is predominantly in the range of between 0.2 and 2 micrometers (200 and 2000 nm).

For comparison with the 32-layer coating system, uncoated polished HS188 specimens were also evaluated. According to the data of FIG. 3, the reflectivity of one uncoated specimen was at a minimum at wavelengths below 500 nm, and gradually increased to about 77% at 2000 nm and about 80% at 3000 nm, with a computed average reflectivity of about 70% between 380 and 1500 nm, which as evidenced by FIG. 4 is the general range over which a considerable amount of black body electromagnetic radiation energy is emitted during the deposition of YSZ by EBPVD. Because thermal radiation is generally in the infrared range of about 780 to about $1\times10^6$ nm (1 mm), the reflectance of the uncoated specimen was relatively low for thermal radiation (780 to about 2000 nm) prevalent during the deposition of YSZ by EBPVD. The low reflectivity of an uncoated component in this range would promote the amount of radiant heating of the component that occurs during a PVD coating operation. In practice, the surface of an HS188 component would be oxidized, resulting in a reflectivity closer to 40% and therefore even higher operating temperatures for the component.

In the 32-layer specimen coated according to the teachings of this invention, the odd-numbered layers (listed in the following table corresponding to layers 16 and 20 of FIG. 1) were silica while the even-numbered layers in the table (corresponding to layers 18 and 22 of FIG. 1) were titania. The thicknesses of the individual layers of this specimen are indicated in the table.

| Layer No. | Material | Thickness (nm) |
|---|---|---|
| 1 | $SiO_2$ | 187.27 |
| 2 | $TiO_2$ | 138.00 |
| 3 | $SiO_2$ | 344.10 |
| 4 | $TiO_2$ | 119.81 |
| 5 | $SiO_2$ | 197.91 |
| 6 | $TiO_2$ | 120.25 |
| 7 | $SiO_2$ | 166.05 |
| 8 | $TiO_2$ | 91.16 |
| 9 | $SiO_2$ | 153.74 |
| 10 | $TiO_2$ | 73.03 |
| 11 | $SiO_2$ | 85.10 |
| 12 | $TiO_2$ | 71.10 |
| 13 | $SiO_2$ | 131.15 |
| 14 | $TiO_2$ | 121.40 |
| 15 | $SiO_2$ | 134.27 |
| 16 | $TiO_2$ | 184.65 |
| 17 | $SiO_2$ | 26.22 |
| 18 | $TiO_2$ | 136.39 |
| 19 | $SiO_2$ | 22.37 |
| 20 | $TiO_2$ | 79.27 |
| 21 | $SiO_2$ | 111.99 |
| 22 | $TiO_2$ | 68.03 |
| 23 | $SiO_2$ | 47.77 |
| 24 | $TiO_2$ | 58.36 |
| 25 | $SiO_2$ | 147.85 |
| 26 | $TiO_2$ | 107.91 |
| 27 | $SiO_2$ | 95.29 |
| 28 | $TiO_2$ | 51.64 |
| 29 | $SiO_2$ | 91.91 |
| 30 | $TiO_2$ | 39.22 |
| 31 | $SiO_2$ | 323.08 |
| 32 | $TiO_2$ | 61.57 |

From the above, it can be seen that the thicknesses of the silica layers ranged from about 22.37 to about 344.10 nm, and had a combined thickness of about 2266 nm. The thicknesses of the titania layers ranged from about 39.22 to about 184.65 nm, for a combined thickness of about 1522 nm. The total coating thickness was about 3788 nm, with the total thickness of the coating attributable to silica and titania being inversely proportional to their respective indices of refraction. Based on the quarter-wave equation, it can be understood that the different thicknesses for individual layers were intended to cover the range of wavelengths desired to be reflected, with the silica layer of each pair typically being thicker than its paired titania layer. The silica/titania thickness ratio for individual pairs of layers was not limited to being the inverse of the indices of refraction of silica and titania ($^{1.5}/_{2.2}$). Instead, the thickness ratios can be seen to range from about 0.19 to about 5.25. The reason for this variance was, for a complex reflective coating, very thin layers (e.g., layers #17 & 19) were included to suppress harmonics, resulting in overall enhanced performance over a broad frequency band. The term "complex" as used here is meant to be in reference to the different indices of refraction for the coating layers, the differing material properties of the layers, and the demanding application intended for the coating.

Figure 2:
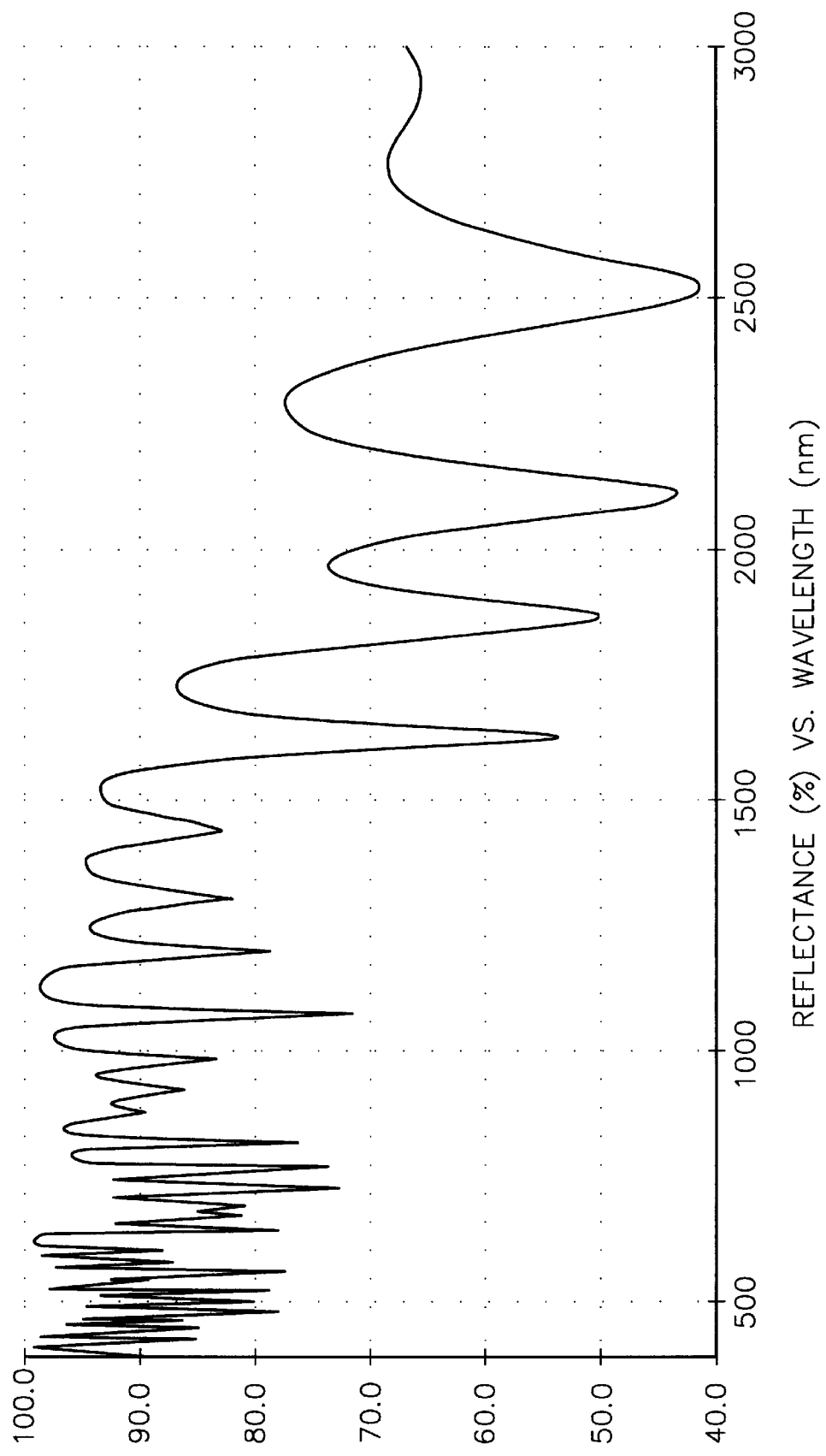
FIG. 2 is a graph showing the reflectance versus wavelength plot for a steel specimen having a reflective coating in accordance with FIG. 1.
Figure 3:
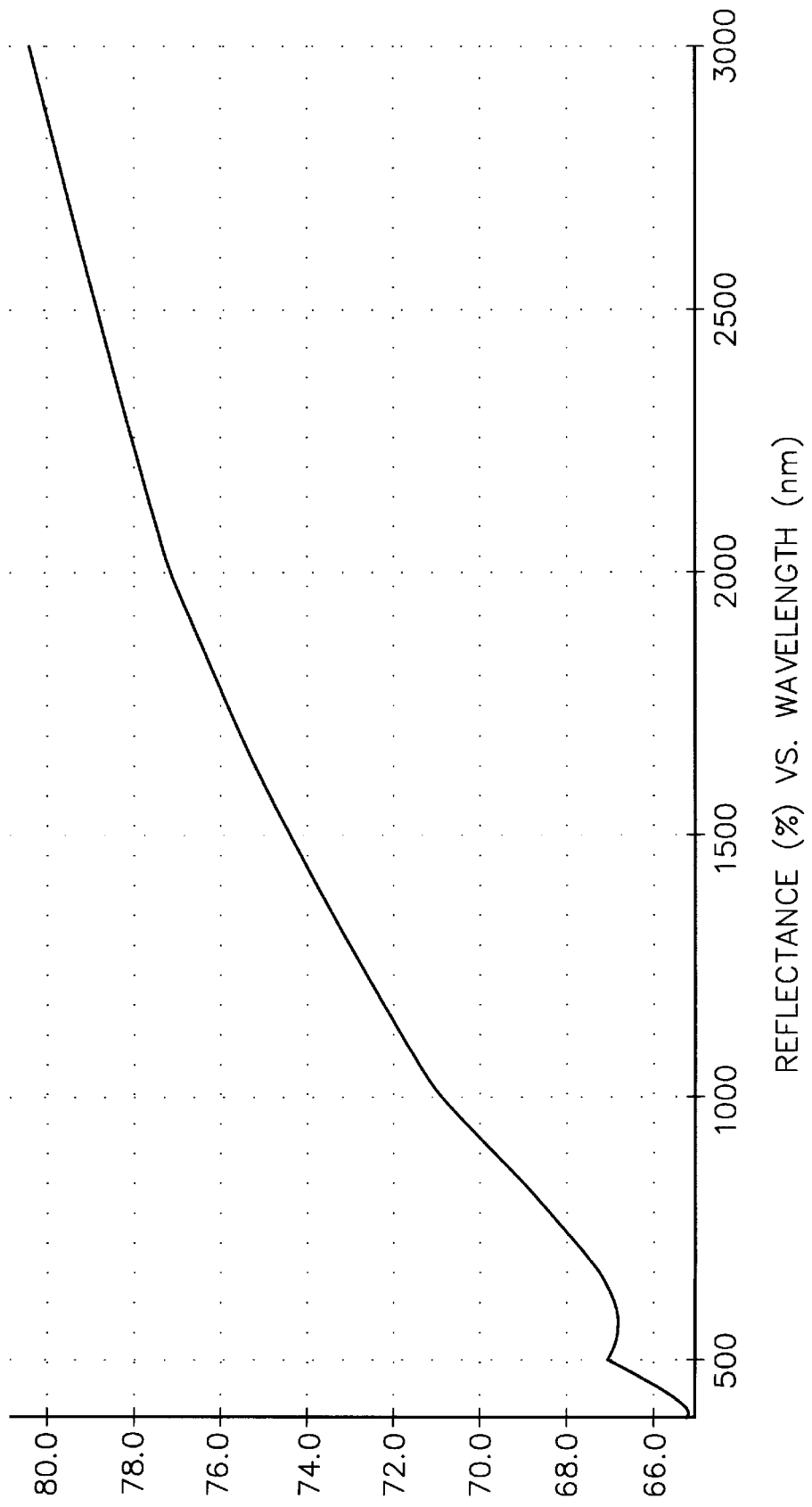
FIG. 3 is a graph showing the reflectance versus wavelength plot for an uncoated steel specimen of the prior art.

As seen from FIG. 2, the reflectivity of the HS188 specimen coated in accordance with this invention was considerably higher at the lower end of the thermal radiation spectrum as compared to the uncoated component of FIG. 3, with a computed average reflectivity between 380 and 1500 nm of about 90%. The high reflectivity of the coated specimen in this range would significantly reduce the amount of radiant heating that occurs with an HS188 component during a PVD coating operation. Based on the above results, it will be understood that coating systems of this invention would also compensate for the relatively poor reflectivity of steel at wavelengths of less than about 1500 nm.

While the invention has been described in terms of a preferred embodiment, it is apparent that other forms could be adopted by one skilled in the art, such as by substituting other suitable coating and substrate materials, or by utilizing various methods for depositing the coating layers. Accordingly, the scope of the invention is to be limited only by the following claims.

What is claimed is:

1. A coating chamber component of a coating apparatus, the component comprising a thermally-reflective coating on a surface thereof, the coating comprising at least two adjacent pairs of layers formed of materials that are substantially transparent to infrared radiation at a predetermined wavelength, an outermost layer of each of the pairs of layers being formed of a material having a higher index of refraction than an innermost layer of the same pair of layers, the innermost layer of at least one of the pairs of layers being thicker than the outermost layer of the same pair of layers, the innermost layer of a second of the pairs of layers being thinner than the outermost layer of the same pair of layers.

2. A coating chamber component as recited in claim 1, wherein the component with the coating has an average reflectivity of at least 90% for electromagnetic wavelengths of about 380 to about 1500 nanometers.

3. A coating chamber component as recited in claim 1, wherein the outermost layer of the pair of layers is a material selected from the group consisting of titania, tantala, zirconia and niobium oxide, and wherein the innermost layer of the pair of layers is a material selected from the group consisting of refractory fluorides, silica and alumina.

4. A coating chamber component as recited in claim 1, wherein the combined thickness of the innermost layers of the pairs of layers is greater than the combined thickness of the outermost layers of the pairs of layers by a factor inversely proportional to their indices of refraction.

5. A coating chamber component as recited in claim 1, wherein the coating has a thickness of about 100 to about 4000 nanometers.

6. A coating chamber component as recited in claim 1, wherein the innermost layer of each of the pairs of layers has an index of refraction of about 1.25 to about 1.7, and the outermost layer of each of the pairs of layers has an index of refraction of about 2.0 to about 2.3.

7. A coating chamber component as recited in claim 1, wherein the materials of the pairs of layers are substantially transparent to electromagnetic wavelengths of between 500 and 3000 nanometers.

8. A coating chamber component as recited in claim 1, wherein the coating comprises sixteen to fifty alternating layers of two materials that are substantially transparent to infrared radiation at wavelengths of between 500 and 3000 nanometers.

9. A coating chamber component as recited in claim 1, wherein the coating comprises sixteen layers of silica alternating with sixteen layers of titania, an innermost layer of the coating being silica and an outermost layer of the coating being titania, the layers of silica having thicknesses of, starting with the innermost layer of the coating and concluding with a silica layer adjacent the outermost layer of the coating, about 187.27, 344.10, 197.91, 166.05, 153.74, 85.10, 131.15, 134.27, 26.22, 22.37, 111.99, 47.77, 147.85, 95.29, 91.91 and 323.08 nm, respectively, and the layers of titania having thicknesses of, starting with a titania layer adjacent the innermost layer of the coating and concluding with the outermost layer of the coating, 138.00, 119.81, 120.25, 91.16, 73.03, 71.10, 121.40, 184.65, 136.39, 79.27, 68.03, 58.36, 107.91, 51.64, 39.22 and 61.57 nm, respectively.

10. A coating chamber component as recited in claim 1, wherein the component is configured to manipulate an article coated in the coating apparatus.

11. A coating chamber component as recited in claim 1, further comprising a physical vapor deposition apparatus having a coating chamber in which the component is mounted.

12. A coating chamber component of a coating apparatus, the component comprising a thermally-reflective coating on a surface thereof, the coating comprising a plurality of layers in which layers of a first material alternate with layers of a second material so as to define adjacent pairs of layers of the first and second materials, the first and second materials being substantially transparent to infrared radiation at a predetermined wavelength, the second material having a higher index of refraction than the first material, an innermost layer of each of the pairs of layers being formed of the first material and an outermost layer of each of the pairs of layers being the second material, the innermost layers of most of the pairs of layers being thicker than the outermost layers of the pairs of layers, the innermost layer of at least one of the pairs of layers being thinner than the outermost layer of the at least one of the pairs of layers to suppress optical harmonics in the coating, the combined thickness of the innermost layers being greater than the combined thickness of the outermost layers by a factor inversely proportional to their indices of refraction.

13. A physical vapor deposition apparatus comprising:
  a component configured to manipulate an article being coated with the apparatus; and
  a thermally-reflective coating on a surface of the component, the coating comprising at least two adjacent pairs of layers formed of metal oxides that are substantially transparent to electromagnetic wavelengths of between 500 and 3000 nanometers, an outermost layer of each of the pairs of layers having a higher index of refraction than an innermost layer of the same pair of layers, the innermost layer of at least one of the pairs of layers being thicker than the outermost layer of the same pair of layers, the innermost layer of a second of the pairs of layers being thinner than the outermost layer of the same pair of layers, the combined thickness of the innermost layers being greater than the combined thickness of the outermost layers by a factor inversely proportional to their indices of refraction.

14. A physical vapor deposition apparatus as recited in claim 13, wherein the component with the coating has a reflectivity of at least 90% for electromagnetic wavelengths of about 380 to about 1500 nanometers.

15. A physical vapor deposition apparatus as recited in claim 13, wherein the coating has a thickness of about 100 to about 4000 nm.

16. A physical vapor deposition apparatus as recited in claim 13, wherein the coating comprises a first layer adjacent the surface of the component, a second layer on the first layer, a third layer on the second layer, and a fourth layer on the third layer, the first and third layers being formed of silica, the second and fourth layers being formed of titania.

17. A physical vapor deposition apparatus as recited in claim 13, wherein the coating comprises sixteen to fifty layers of materials that are substantially transparent to infrared radiation at wavelengths of between 500 and 3000 nanometers.

18. A physical vapor deposition apparatus as recited in claim 13, wherein the coating comprises sixteen layers of silica alternating with sixteen layers of titania, an innermost layer of the coating being silica and an outermost layer of the coating being titania, the layers of silica having thicknesses of, starting with the innermost layer of the coating and concluding with a silica layer adjacent the outermost layer of the coating, about 187.27, 344.10, 197.91, 166.05, 153.74, 85.10, 131.15, 134.27, 26.22, 22.37, 111.99, 47.77, 147.85, 95.29, 91.91 and 323.08 nm, respectively, and the layers of titania having thicknesses of, starting with a titania layer adjacent the innermost layer of the coating and concluding with the outermost layer of the coating, 138.00, 119.81, 120.25, 91.16, 73.03, 71.10, 121.40, 184.65, 136.39, 79.27, 68.03, 58.36, 107.91, 51.64, 39.22 and 61.57 nm, respectively.

\* \* \* \* \*